United States Patent
Reppert et al.

(10) Patent No.: US 7,818,816 B1
(45) Date of Patent: Oct. 19, 2010

(54) SUBSTRATE PATTERNING BY ELECTRON EMISSION-INDUCED DISPLACEMENT

(75) Inventors: Jason B. Reppert, Central, SC (US); Jay B. Gaillard, Yadkinville, NC (US); Bevan C. Elliott, Greenville, SC (US); Doyl E. Dickel, Central, SC (US); M. Pinar Mengüc, Lexington, KY (US); Apparao M. Rao, Anderson, SC (US)

(73) Assignee: Clemson University Research Foundation, Anderson, SC (US)

( * ) Notice: Subject to any disclaimer, the term of this patent is extended or adjusted under 35 U.S.C. 154(b) by 213 days.

(21) Appl. No.: 12/243,402

(22) Filed: Oct. 1, 2008

Related U.S. Application Data (60) Provisional application No. 60/976,558, filed on Oct. 1, 2007.

(51) Int. Cl.
*G01N 13/16* (2006.01)
*G01B 5/28* (2006.01)

(52) U.S. Cl. .................. 850/1; 850/5; 850/33; 250/306; 250/310; 73/105

(58) Field of Classification Search .................. 850/1.5, 850/33; 250/306, 310; 73/105
See application file for complete search history.

(56) References Cited

U.S. PATENT DOCUMENTS

| | | | |
|---|---|---|---|
| 5,412,980 A * | 5/1995 | Elings et al. ................... 73/105 |
| 5,849,173 A | 12/1998 | Chandross et al. | |
| 5,861,549 A | 1/1999 | Neukermans et al. | |
| 6,279,389 B1 | 8/2001 | Adderton et al. | |
| 6,997,039 B2 | 2/2006 | Rao et al. | |
| 7,514,214 B2 * | 4/2009 | Wade et al. .................... 435/6 |
| 7,687,876 B2 * | 3/2010 | Kabir ........................ 257/471 |
| 2003/0222668 A1 | 12/2003 | Hung et al. | |
| 2007/0194225 A1 * | 8/2007 | Zorn ......................... 250/306 |

OTHER PUBLICATIONS

Brongersma, et al., "Electromagnetic energy transfer and switching in nanoparticle chain arrays below the diffraction limit", vol. 62, No. 24, Dec. 2000.

\* cited by examiner

*Primary Examiner*—Nikita Wells
(74) *Attorney, Agent, or Firm*—Dority & Manning, P.A.

(57) ABSTRACT

Disclosed are methods and devices for patterning micro- and/or nano-sized pattern elements on a substrate using field emitted electrons from an element. Disclosed methods and devices can also be utilized to form nano- and micron-sized depressions in a substrate according to a more economical process than as has been utilized in the past. Methods include single-step methods by which structures can be simultaneously created and located at desired locations on a substrate. Methods include the application of a bias voltage between a probe tip and a substrate held at a relatively close gap distance. The applied voltage can promote current flow between the probe and the substrate via field emissions. During a voltage pulse, and within predetermined energy levels and tip-to-surface gap distances, three dimensional formations can be developed on the substrate surface.

22 Claims, 7 Drawing Sheets

SUBSTRATE PATTERNING BY ELECTRON EMISSION-INDUCED DISPLACEMENT

CROSS REFERENCE TO RELATED APPLICATION

The present application claims filing benefit of U.S. provisional patent application Ser. No. 60/976,558 filed on Oct. 1, 2007, which is hereby incorporated by reference in its entirety.

FEDERALLY SPONSORED RESEARCH AND DEVELOPMENT

The United States Government may have rights in this invention pursuant to National Science Foundation Grant NIRT 0304019.

BACKGROUND

Advances in nanoscience and nanotechnology research hinge on the ability to fabricate/manipulate nano-sized structures at desired locations on any given substrate. While several growth methods have been developed, most of these fall short of the desired goals. For example, gold or silver nanoparticles can be readily prepared via chemical routes, but coaxing them to lay in an ordered array warrants the use of time consuming atomic force microscopy (AFM)-based or scanning tunneling microscopy (STM)-based techniques.

The current state of the art in nanopillar and nanoparticle array formation involves methods such as the following: evaporating or electrochemically depositing gold onto templated surfaces such as alumina, followed by the removal of the template; colloidal lithography, where the self-arrangement of spherical colloid particles provides evenly-spaced voids that can be filled by metal; Focused Ion Beam (FIB) milling, where a thin film of metal is deposited on a substrate, and regular structures are patterned out of it by the controlled ion beam, or by forming holes in a photoresist, followed by filling of the holes with metal; and electron beam lithography (EBL), in which utilizing a scanning electron microscope (SEM), patterns are drawn on a photoresist, followed by deposition of metal into the resulting pattern. Though each of the above methods can produce regularly spaced nanopillars or nanoparticles with reasonable control of aspect ratio, each method is, to varying degrees, time consuming, step-involved, and expensive. Conversely, though simple evaporation deposition of metallic nanoparticles from a colloid onto a substrate is fast and inexpensive, the arrays produced do not exhibit regular particle-particle spacing, and the size and shape of individual particles are not uniform. The limitations of these methods have created a bottleneck between the study of the fundamental characteristics of patterned nanostructures and the utilization of such technology in scaled-up, mass-produced devices.

What are needed in the art are simpler, more economical methods and devices for forming patterns on a substrate on micro- and nanosized scales.

SUMMARY

According to one embodiment, disclosed is a method for forming an element on a substrate. An element can be, for instance, a structure that develops from a surface of a substrate, such as a pillar, a sphere, or the like. For example, an element can have an aspect ratio greater than about 1.

A method can include, for instance, locating a probe tip at a distance of less than about 5 μm from a surface of a substrate such that there is a gap between the probe tip and the substrate surface, establishing a vacuum pressure of at least about $10^{-3}$ torr in the area that includes the probe tip and the substrate, applying a bias voltage between the probe tip and the substrate and thereby establishing a current flow between the substrate and the probe tip via field emission, and maintaining the bias voltage for a pulse period, wherein upon establishment of a current density of at least about 600 amps per square meter ($A/m^2$) at that area of the substrate surface that is closest to the probe tip.

In general, the substrate can include a semiconductive material such as, for example, silicon or doped silicon. The substrate can include additional materials as well. For example, the substrate can be a multi-layer substrate and can include a polymeric layer, a metal layer, and so forth.

A probe tip can include an at least semiconductive material. For example, a probe tip can include a metal, such as tungsten. In one embodiment, a carbon nanotube can be utilized as a probe tip, and in one particular embodiment, a multiwalled carbon nanotube can be used.

Also disclosed herein are devices that can be used for carrying out disclosed methods. A device can include, for example, a probe including a probe tip, a power supply for supplying a bias voltage between a probe tip and a substrate, a stage upon which a substrate can be held, and an enclosure, within which the probe tip and the stage can be held at a vacuum pressure during a patterning process.

BRIEF DESCRIPTION OF THE FIGURES

The present invention will become more fully understood from the detailed description and the accompanying drawings, wherein.

Repeat use of reference characters in the present specification and drawings is intended to represent the same or analogous features or elements of the present invention.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment, may be used in another embodiment to yield a still further embodiment.

According to presently disclosed methods, nano- and micron-sized structures such as, for example, pillars, spheres, and the like, can be rapidly written on a substrate using field emitted electrons from a sharpened element such as a tungsten or tungsten-coated probe or a nanotube. Disclosed methods and devices can also be utilized to form nano- and micron-sized depressions in a substrate according to a more economical process than as has been utilized in the past. For instance, a depression that extends partially or completely through the depth of a substrate can be formed. For example, a polymer film layer having a depth on the order of about 100 nm can have a depression formed in the layer that can extend only partially through the layer, for instance on the order of between about 50 nm and about 90 nm. Beneficially, a single device can be utilized to form both nano-sized and micro-sized formations on a substrate.

Disclosed devices can be much more economical as compared to previously known micro- and nano-machining devices. Disclosed methods include single-step methods by which structures can be simultaneously created and located at desired locations on a substrate. Using disclosed methods and devices, nano- and/or micro-sized patterns can be fabricated at a fraction of the costs incurred by previously known techniques.

In general, methods include the application of a bias voltage between a probe tip and a substrate held at a relatively close gap distance. Due to the nature of the materials involved and the small gap distance, the applied voltage can allow current to flow between the probe and the substrate via field emissions. During a voltage pulse, and within disclosed energy levels and tip-to-surface gap distances, which determine the energy density applied to the substrate at the targeted locale, three dimensional formations can be developed on the substrate surface.

Figure 1:
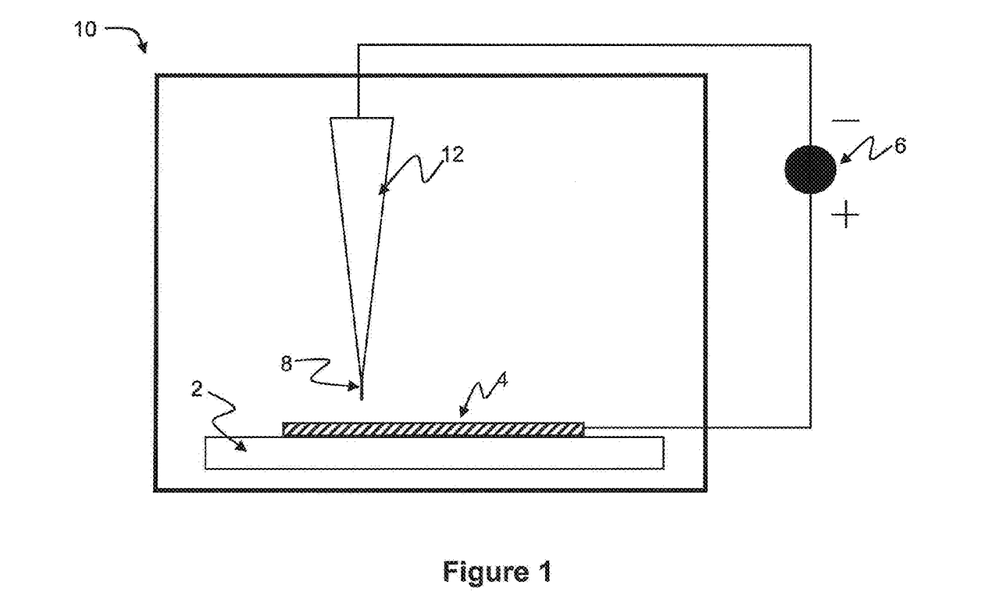
FIG. 1 is a schematic representation of one embodiment of a system as disclosed herein.

FIG. 1 illustrates a system 10 as may be utilized in one embodiment. System 10 includes a sharpened probe tip 8 that can function as an electron emitter during a patterning process. Accordingly, a probe tip 8 can include an at least semi-conductive material. For instance, a probe tip can be formed entirely of a conductive or semi-conductive material or can include a conductive or semi-conductive material as a coating on the surface of the probe tip 8. In one preferred embodiment, a probe tip can include tungsten; however, probe tip materials are not in any way limited to tungsten probe tips. In general, the probe tip can be comprised of any conducting material A probe tip can generally have a tip diameter of less than about 500 nm, or less than 100 nm in other embodiments, or even smaller in other embodiments, for instance less than about 50 nm. Sharpened tungsten probe tips and methods for forming such are generally known in the art. For instance, U.S. Patent Application Publication 2003/0222668 to Hung, et al., and U.S. Pat. No. 5,849,173 to Chandross, et al., both of which are incorporated herein by reference, discuss formation methods for forming sharpened tungsten probe tips as may be utilized in disclosed systems and methods. Other suitable formation methods can include FIB milling, and the like.

In one preferred embodiment, a probe tip can be a carbon nanotube. Carbon nanotubes can be either single walled carbon nanotubes (SWNTs) or multiwalled carbon nanotubes (MWNTs). A carbon nanotube (CNT) probe tip can be formed according to any formation process as is known in the art. For example, in one embodiment, a SWNT probe tip can be formed using a plasma CVD method. According to this method, a hydrocarbon source is decomposed in the presence of an inert atmosphere and a catalyst-coated cantilever. The catalyst is typically a transition metal or a mixture of transition metals with dimensions less than 5 nm. SWNTs produced according to this method can have a diameter of 1-5 nm and are generally several microns in length. SWNTs formed according to any specific method are not a requirement of disclosed systems. Any SWNT formation method can be utilized, for instance laser-vaporization methods, electric arc methods, and the like.

Figure 4:
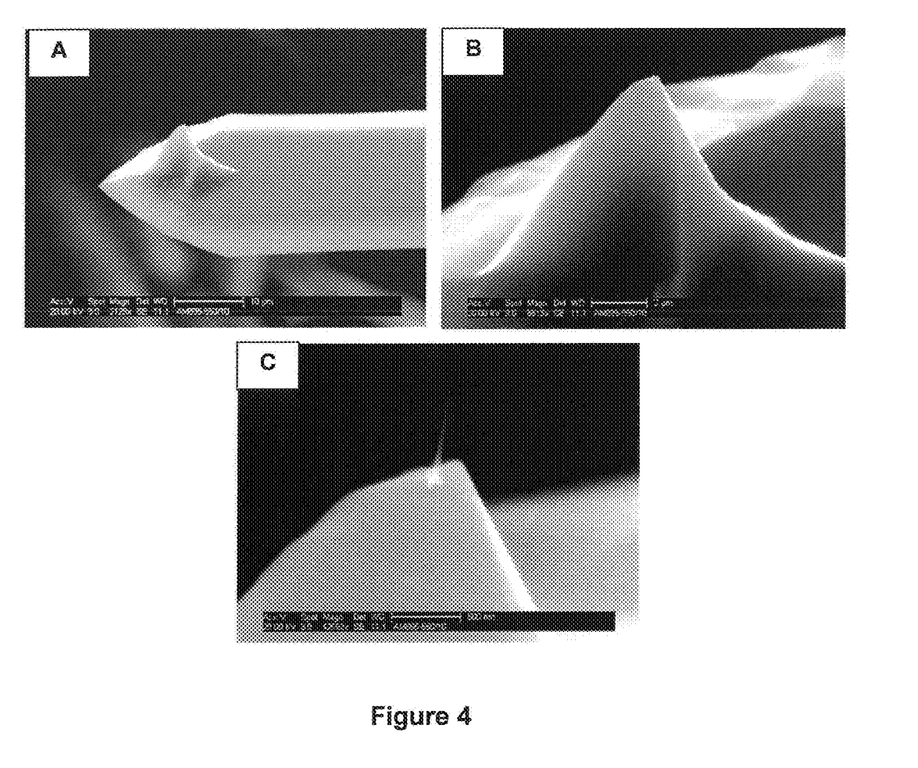
FIGS. 4A-4C are SEM images of one embodiment of a probe tip as may be utilized as described herein.
Figure 5:
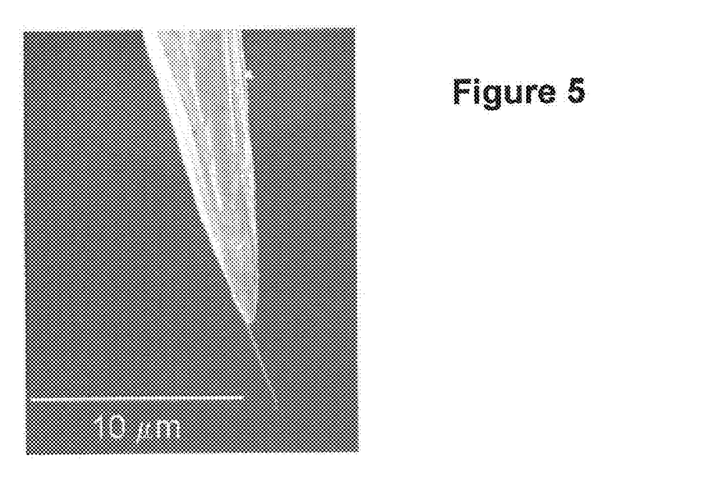
FIG. 5 is an SEM image of another probe tip as may be utilized as described herein.

A carbon nanotube need not be grown directly on a cantilever as shown in FIG. 4. For instance, according to one embodiment, a nanotube can be grown on planar substrates and subsequently attached to a sharpened metallic probe tip, as shown in FIG. 5. For instance, a mat or forest of CNTs can be formed according to any desired process, following which a single CNT can be teased out of the forest by applying a small dc (2-4 V) voltage across the nanotube forest and the tungsten tip. Of course, any method as is known to one of skill in the art can be utilized to attach a probe tip to a probe.

As previously mentioned, a MWNT can be used as a probe tip. MWNTs can be formed according to any known method or obtained from any hydrocarbon source. For instance, a chemical vapor deposition method, such as that described in U.S. Pat. No. 6,997,039 to Rao, et al., which incorporated herein by reference, can be used. According to this exemplary method, highly aligned and high purity MWNTs can be produced by the thermal decomposition of a xylene-ferrocene mixture. The xylene serves as a hydrocarbon source and ferrocene provides iron catalyst nanoparticles that can seed the nascent nanotubes. For example, ferrocene (approximately 1 at. %) can be dissolved in xylene and fed into a quartz tube at a flow rate of about 1 ml/hr. The mixture can vaporize upon reaching the end of a pre-heater (maintained at about 200° C.), and the vapors can then be carried into a furnace in an inert flow. The furnace can be maintained at a temperature (e.g., about 750° C.) that enables the xylene/ferrocene mixture to decompose and form the MWNTs. The nanotubes can be harvested from the walls of the furnace and, in one embodiment, can have a diameter of about 25 nm. Aligned SWNTs as may be utilized as disclosed herein have been prepared by similar methods.

It should be understood that the specific method of forming nanotubes as may be utilized as described herein is not critical to the disclosed subject matter, and the described methods are merely exemplary, and not meant to be in any way limiting. Likewise, methods described utilizing carbon nanotubes are not meant to be in any way limiting. For example, metallic one-dimensional structures (e.g. metallic nanowires) can be used as probe tips.

FIGS. 4A-4C illustrate a probe tip including a MWNT as may be utilized according to one embodiment. In this particular embodiment, a tungsten probe is shown in increasing magnification in the Figures. The probe includes a single MWNT probe tip adhered to the end, as may be seen in FIG. 4C.

Another embodiment of a MWNT probe tip is illustrated in FIG. 5, which includes a single MWNT adhered to the end of a tungsten probe of a different geometry from that of FIGS. 4A-4C.

Referring again to FIG. 1, a probe tip 8 can be connected via probe 12 (e.g., a tungsten probe 12) to a power supply 6. One example of a power supply that can be utilized can be a power supply that can vary the pulse duration, bias, and voltage such as, for example, a PVX-4450+/−1.8 kV Microprocessor Controlled Pulse Generator available from Directed Energy, Inc. In one embodiment, a power supply can be provided that can tune pulse width from continuous power down to microsecond duration, and can vary the duty cycle down to about 5%. In one embodiment, a power supply can be interfaced with and controlled by a computer to facilitate an automated process according to known methodology.

The power supply 6 can be connected to substrate 4. Substrate 4 includes an upper surface upon which nano- and/or micro-sized patterned elements can be formed according to disclosed methods. Substrate 4 can be a single layer or can be a multi-layered material. For instance, a single layer substrate 4 can generally be formed of a semiconductive or a doped semiconductive material. Exemplary semiconductive materials can include, without limitation, silicon, germanium, silicon carbide and the like. For example, a single layer substrate 4 can be formed of silicon or doped silicon. Dopants can be used to, for example, increase the conductivity of the semiconductive material. For instance, a Group IV semiconductor can be doped with a Group V dopant, according to standard methodology.

Substrate 4 can include additional materials in conjunction with a semiconductor or doped semiconductor. For instance, substrate 4 can include multiple layers, at least one of which can include a semiconductor or doped semiconductor. For instance, substrate 4 can include layers of conductive, semiconductive, or nonconductive materials. In addition, additional layers can be hard or soft materials. Exemplary materials can include metals such as gold and silver; conductive polymers such as poly(acetylene)s, poly(pyrrole)s, poly(thiophene)s, poly(aniline)s, poly(fluorene)s, poly(3-alkylthiophene)s, polytetrathiafulvalenes, polynaphthalenes, poly(p-phenylene sulfide), poly(para-phenylene vinylene)s, and so forth; and nonconductive polymers, including polymethylmethacrylate, and so forth. For example, a multi-layered substrate 4 can include a silicon base and a metal or polymeric layer on top of the silicon base such that a micro- or nano-scale patter can be formed on or in the upper layer.

A system 10 can be isolated from the surrounding environment, as shown, in order to establish a vacuum at the substrate surface during a pattern formation process. For instance, the surrounding atmosphere can be at a pressure of less than about $10^{-3}$ torr during a patterning process. In one embodiment, a surrounding atmosphere can be at a pressure of between about $10^{-3}$ and about $10^{-9}$ torr during a formation process.

Upon establishment of a vacuum pressure in the enclosure, a bias voltage can be applied across the gap formed between a probe tip 8 and a substrate 4 for a period of time to encourage electron emission from the probe tip and current flow between the two via field emission. For instance, applied voltages can be up to about 1000V, for instance between about 100V and about 1000V, in one embodiment.

The gap distance can be such that current can flow between the two via field emission. For instance, the probe tip 8 and the substrate 4 can be located with respect to one another at a gap distance of less than about 5 μm. Preferred gap distance can vary depending upon materials of the system as well as size and shape of pattern structures to be formed by a process. For instance, the gap distance between the probe tip and the substrate can dictate the morphology of the shapes formed on the substrate. In addition, this parameter can affect the bias voltage, the profile of the emission current, and the energy transfer to the substrate.

Voltage can be applied across the gap distance for a relatively short period of time, generally less than about 60 seconds, for instance less than about 30 seconds, in one embodiment, or shorter pulses in another embodiment, for example less than about 10 seconds, or less than about 5 seconds. In one embodiment, a pulse can be less than one second. Once established, the electric field established during the pulse period can be unaffected by the gap distance during the period of discharge.

The current density at the substrate surface will be a function of current (in turn dependent upon voltage and pulse duration) as well as gap distance, as is known to one of skill in the art. Upon establishment of a current density of greater than about 600 A/m$^2$, the substrate can deform to define either positive (e.g., pillars) or negative (e.g., holes) features in or on the substrate. More specifically, in those embodiments in which the upper surface of the substrate is a polymeric material, holes can be formed in the polymeric material. When the current flows from the probe tip to a semiconductive material, or a semiconductive material coated with a metal, the substrate can deform to define a feature that stands above the original substrate surface. Though generally termed 'pillars' throughout this disclosure, structures formed above the surface of a substrate can be of any height and shape. Thus, formed structures can have an aspect ratio less than, equal to or greater than one. Moreover, formed structures can have any cross sectional shape including round, square, multi-faceted, or the like.

In one embodiment, disclosed methods can form pattern elements that extend through multiple layers of a multi-layer substrate. For example, in one embodiment, a multi-layer substrate can include a semiconductive base coated with a polymeric upper layer. Upon establishment of a suitable current density at a site on the substrate, a hole can form in the polymeric upper layer of the substrate. Following formation of the hole completely through the polymeric layer, the semiconductive lower layer can be exposed to the energy pulse. Upon suitable energy transfer, a pillar can then form on the surface of the lower layer of material. While not wishing to be bound by any particular theory, it is believed that upon destruction of the polymer forming the upper layer of such a substrate, ions form in the now open space that can improve the conductive path for the electrons emitted from the probe tip and encourage formation of a pillar on the lower, non-polymeric layer of the substrate.

While not wishing to bound by any particular theory, preliminary models suggest that a combined thermal and mechanical effect may be the reason for the formation of the structures, which appear to grow as a function of field emission strength and duration. For instance, pillars are believed to be formed at least in part as a result of the strong electrostatic force between the anode and cathode, locally deforming and pulling the substrate upward. Moreover, while the realized current is not sufficient to melt the substrate, it is believed that there may be significant heating of the substrate during the process, and the pillars are believed to be formed at least in part as a result of thermal expansion under intensive electron heating. Current understanding is that a combination of effects results in formation of structures on the substrate surface at suitable current density.

Varying pulse times and amplitudes is believed to affect the displacement of the atoms in the substrate, and can manifest as changes in the diameter and height of the pillar or depth of the hole, allowing fine control of the size and aspect ratio of the features formed on the substrate.

Variation in gap distance can also affect the diameter of the structure on the substrate surface, providing another route for control of formed features. Gap distance can have additional effects on a pattern formed according to disclosed methods, as well. For instance, upon formation of a pillar on a substrate, smaller nano-sized structures have been observed around the central pillar, further details of which can be found in the Example section, below. There is a definite area in which these nanostructures appear; this halo of nano-structures have been found to be proportional to the field-emission spread, and is believed to be due to fringe-like interference patterns. Thus, in one embodiment, gap distance can affect the size and number of surrounding smaller structures formed around a larger central pillar and can be utilized to form a plurality of structures on a substrate surface with a single emission pulse.

Figure 6:
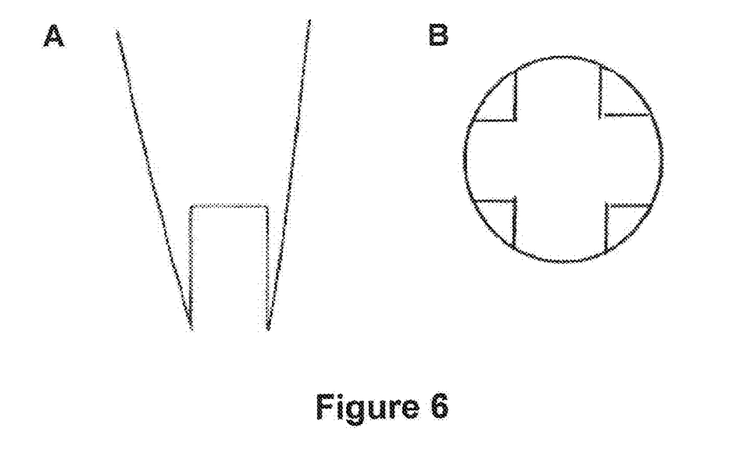
FIGS. 6A and 6B are two views of one embodiment of a probe including multiple probe tips as may be utilized in one embodiment of the disclosed systems.

Other methods can be used to form multiple structures as well. For instance, in addition to the capability to form essentially one dimensional pillars on a nano- or micro-scale as well as two dimensional line structures, disclosed methods can be utilized to form three dimensional interference patterns on substrates in a single step. For example, in one embodiment, a single probe can include multiple probe tips, each of which can function as an electron emission site. For example, a single tungsten probe tip can be shaped, for instance via FIB milling, to include multiple probe tips, one embodiment of which is schematically illustrated in FIG. 6 including a side view (FIG. 6A) and a lower view (FIG. 6B). As can be seen, in this particular embodiment, probe 15 has been modified to define four probe tips, 16, 17, 18, and 19. By modifying a probe to create multiple emission sites from a single probe, a predetermined interference pattern can be established and a pattern of multiple structures can be permanently written in a substrate.

Based on the distance between the emitter tips and the tip-to-substrate distance, control over both the pattern shape and size on the substrate can be maintained. The line interference patterns written on the substrate using disclosed methods can represent permanent 3D structures which can be repeated as separate units in different configurations on the substrate. With such patterns of features, new and novel optical properties caused by energy transfer via plasmons through these arrays can be provided.

Referring again to FIG. 1, substrate 4 can be located on a stage 2. Stage 2 can be a positioning stage as is commonly utilized in AFM imaging techniques. Such positioning stages are generally known in the art, and thus are not described at length herein. XY and XYZ positioning stages have been described, for instance in U.S. Pat. Nos. 5,861,549 to Neukermans, et al., 6,279,389 to Adderton, et al., and 5,412,980 to Elings, et al., all of which are incorporated herein by reference. During formation of a pattern on a substrate, a positioning stage 2 can be utilized to relocate a substrate 4 beneath a probe tip 8 so as to form a controlled pattern of structures on the surface of the substrate 4 as described herein. In general, motion of a positioning stage 2 can be controlled to a nanometer scale.

Precise control over lateral movement of the probe tip can be facilitated with an XYZ positioning stage 2, resulting in well-defined individual nanopillar-to-nanopillar separation. Moreover, by varying the emission time and controlling probe tip lateral movement in tandem, arrays and other increasingly complicated patterns can be written on substrates by transitioning between pulsed and continuous emission, forming both one dimensional and two dimensional features.

Figure 2:
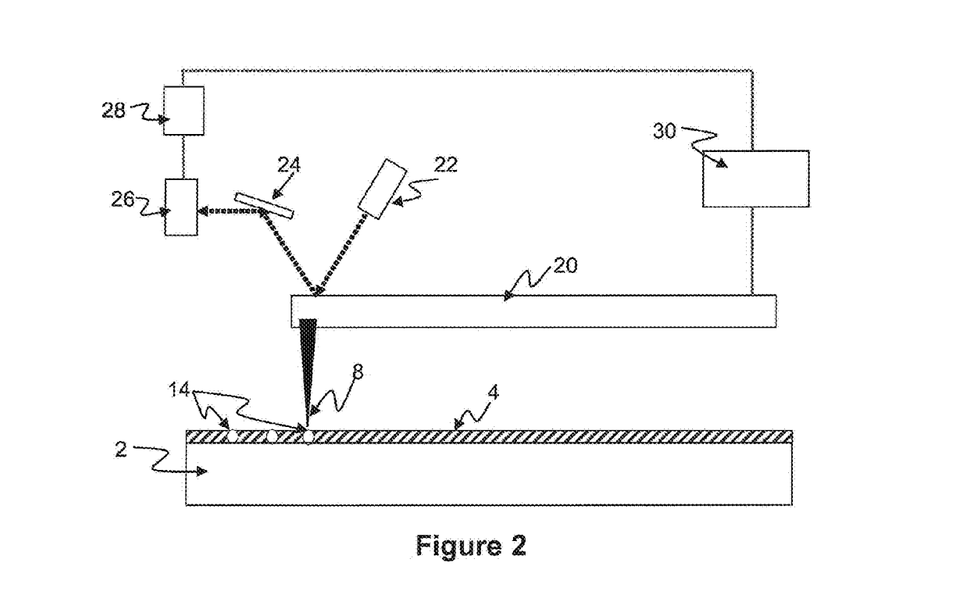
FIG. 2 is a schematic representation of another embodiment of a system as disclosed herein.

FIG. 2 illustrates another embodiment of a system as may be utilized as described herein. According to this embodiment, a probe tip 8 can be located on a cantilever beam 20. The cantilever beam 20 supports the probe tip 8 over a substrate 4 supported on a stage 2 that can be operated to translate the substrate 4 in X, Y and Z directions, with the Z direction being in a direction toward or away from the probe tip 8. Optionally, the cantilever beam 20 can also be moveable in the lateral direction, so as to provide additional control over pattern formation on a substrate 4. In a conventional fashion, a laser 22 can be reflected off of the cantilever beam 20, and the reflected beam can be deflected by a mirror 24 to a photodetector 26 that provides an output signal on a line 21 to a feedback controller 30, optionally with additional circuit components such as an amplifier 28, and so forth. The feedback controller 30 can then provide an output signal on a line at a frequency $f_1$ to a cantilever vibration driver (not shown) that is coupled to the cantilever beam 20 to vibrate the beam 20 at the drive frequency $f_1$. During use, the vibrating cantilever beam 20 can bring the probe tip 8 to a predetermined gap distance so as to provide the desired current density at the substrate 4 and form a pattern element 14 on or in the surface of substrate 4. The motion controls of the cantilever beam 20 and the positioning stage 2 can be utilized to move the probe tip 8 and the substrate 4 with respect to one another, such that a pattern of pattern elements 14 can be formed on the substrate. Pattern elements 14 can be formed with a single pulse of current between probe tip 8 and substrate 4 (i.e., a single vibration of cantilever beam 20 at the pattern element location) or following several vibrations of the beam 20 over the pattern element location, depending upon materials involved, applied voltage, vibration speed, and the like.

Figure 3:
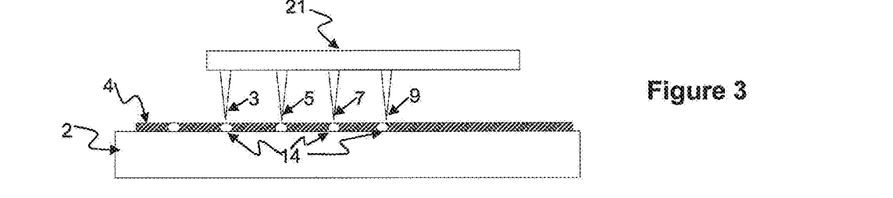
FIG. 3 is a schematic representation of another embodiment of a system as disclosed herein.

FIG. 3 illustrates another embodiment of a system including a cantilever beam 21 and a plurality of spaced apart probe tips 3, 5, 7, 9 on the cantilever beam 21. Cantilever beam 21 can be utilized similar to cantilever beam 20, but can form a plurality of pattern elements 14 at one time. In contrast to the probe of FIG. 6, including a single probe 15 defining a plurality of probe tips 16, 17, 18, 19, the multiple probe tips 3, 5, 7, 9 on cantilever beam 21 can be located at a distance from one another such that there are no interference patterns between the electron emissions from the individual probe tips.

Disclosed methods can eliminate many weaknesses of the previously known methods used for micro- and nanoparticle array formation. For example, disclosed methods require no prior preparation of a substrate by templating or deposition of additional photoresist layers. In addition, each individual pillar is created on a very small time scale in a single step, and is individually tailorable as to size, aspect ratio, and its proximity with other nanopillars.

Figure 7:
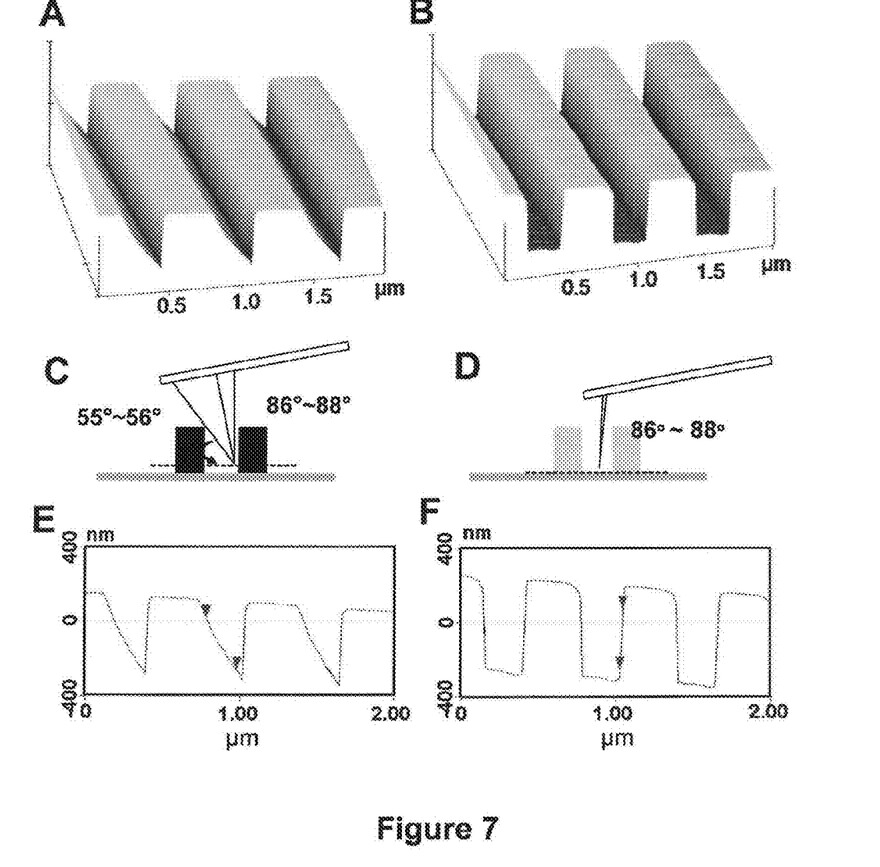
FIGS. 7A-7F illustrate differences in formation shapes as may be formed according to methods as disclosed herein as compared to formation formed with previously known silicon-based tips as have been utilized in formation methods in the past.

Disclosed methods and devices can also provide for good control of formations made into the surface of a substrate. For example, and with reference to FIG. 7, probe tips, such as silicon probe tips used in previously known formation processes, such as FIB, have a wide, angled cross sectional shape, as shown in FIG. 7C. Thus, when forming an indentation or a hole in a substrate using this sort of a device, the formed shape will likewise have an angled cross shape, as can be seen in a three dimensional view at FIG. 7A and in cross section at FIG. 7B. Disclosed methods, however, can utilize a much smaller probe tip, for instance a MWNT, as shown at FIG. 7D. Thus, an indentation or hole formed in a substrate surface can define much sharper side walls, i.e., side walls that are much closer to parallel as compared to indentations formed with larger probe tips, as can be seen in FIGS. 7B and 7D.

Recent advances in patterning pairs of nanopillars on a substrate have shown unique negative refractive optical properties. Precise control of the nanopillar pair spacing and pillar morphology is essential to furthering this exciting new area of study. Disclosed methods can enable the quick printing of large substrate areas with the predetermined patterns at high speed and precision. Moreover, disclosed methods can facilitate tuning pattern parameters for optimization.

It has been recently discovered that one dimensional nanoparticle chains can act as tunable optical antennas, which also demonstrated that such patterns can allow light wavelength adjustable optical switching. (Brongersma, et al., *Phys. Rev. B* 2000, 62, R16356-R16359) Such optical switches can form the basis for optical circuits printed on substrates according to disclosed methods, as disclosed methods can be ideal for duplicating and tuning chain antenna parameters. The nanoparticle optical switch can form the basis for writing nanocircuits controlled by light, which could lead toward computing at speeds many orders of magnitude over current technology. Through utilization of disclosed technology, many different patterns could be rapidly drawn and examined, beginning with switches, optical storage locations, and simple logic gates. In addition, investigations into tuning the spacing and morphology of patterned pillars for optimal field coupling performance can facilitate a decrease in energy loss during the energy transfer, enabling information transfer over longer distances than have been previously possible.

Disclosed subject matter may be better understood with reference to the Examples, set forth below.

EXAMPLE 1

A silicon substrate that was pre-coated with an approximately 30 nm film of gold and fixed in position to serve as the work piece in a system similar to that illustrated in FIG. 1. A 1D nano-positioning stage was used to manipulate a sharpened tungsten probe tip (tip diameter about 100 nm) to within a gap distance of about 4 μm from the work piece. The assembly was then placed inside a vacuum chamber and evacuated to $1 \times 10^{-5}$ torr. The probe tip was grounded, a positive dc bias was applied to the work piece, and the respective emission currents (on the order of nA) were measured.

Preformed markers on the 30 nm Au film allowed examination of the morphology of the areas on the gold film that were directly under the probe tip. Two examples of such areas can be seen in the scanning electron microscope image of FIG. 8.

Figure 8:
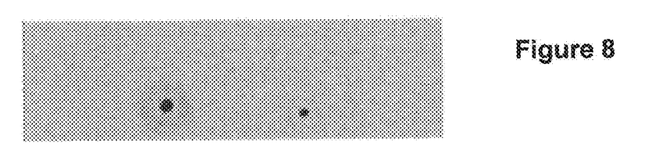
FIG. 8 is an SEM image of two pillars formed as described herein.
Figure 9A:
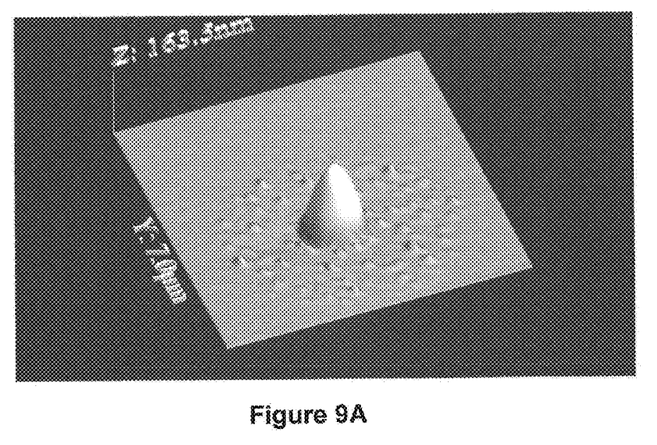
FIGS. 9A-9C are various images of the area of pillar A of FIG. 8 including an AFM 3D view of the area of pillar A (FIG. 9A), a top view (FIG. 9B) and a height profile deduced from the line scan shown in FIG. 9B (FIG. 9C)
Figure 9B:
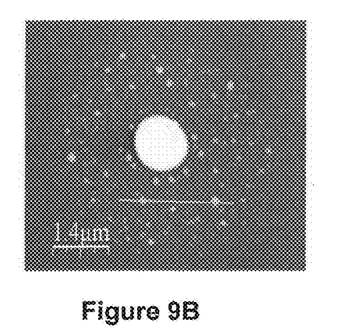
Figure 9C:
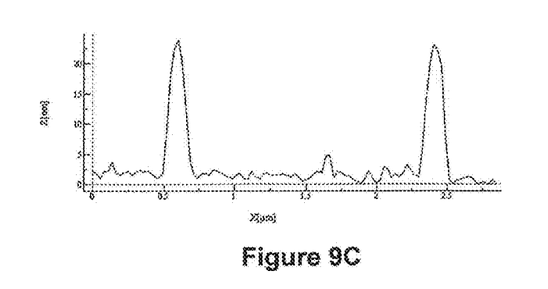

The areas labeled A and B on FIG. 8 were created upon application of a bias voltage of 1000 and 200 V for 5 seconds each, respectively. A three dimensional view of area A is shown in the AFM image of FIG. 9A. As can be seen, the image suggests that pillars, both on the micron and nanometer scale, were formed under the experimental conditions. The large central pillar A was found to be approximately 160 nm in height. FIG. 9B is top view of the area imaged in FIG. 9A, and a line scan across the line marked in FIG. 9B, including smaller nano-sized formations present in the halo around the central pillar, revealed their average height to be about 20 nm with an average full-width-at-half-maximum-height of 150 nm (FIG. 9C).

Figure 10:
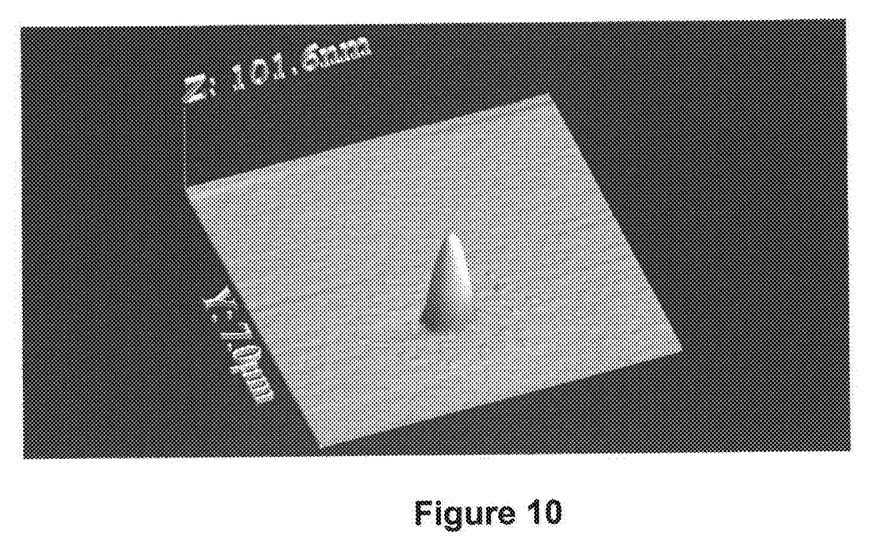
FIG. 10 is an AFM 3D view of the area of FIG. 8 including pillar B.

FIG. 10 is an AFM image of the pillar B of FIG. 8. The large central pillar B was found to be about 100 nm in height. As can be seen, when run at the lower bias voltage, a halo of smaller formations was still formed, though they appear to be small and fewer in number. There is a definite area in which these nanostructures appear; this halo is proportional to the field-emission spread, and is believed to be due to fringe-like interference patterns.

EXAMPLE 2

Figure 11:
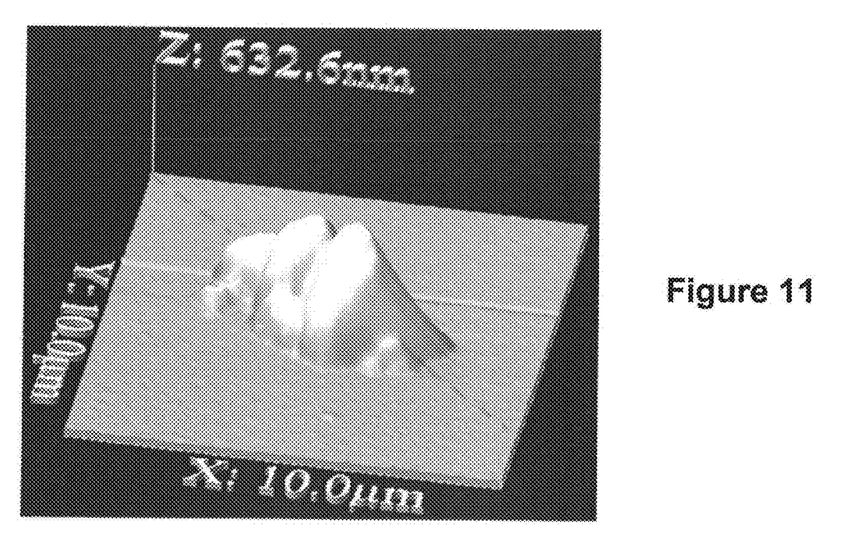
FIG. 11 is an AFM image of an ensemble of pillars formed as described herein.

A nanopositioning stage such as used in Example 1 can facilitate high precision displacement along one direction. An approximately 30 nm thick silver film was deposited on a silicon substrate, and an experiment similar to Example 1 was carried out. However, in this example, the electron emission time was lengthened, and the probe allowed to drift step-wise across the substrate. FIG. 11 shows the ensemble of adjoining pillars that were produced. This result suggests that continuous emission paired with precise lateral control of the probe tip will allow writing single 2D structures on the substrate.

EXAMPLE 3

Gap distance and current were varied over time between a MWNT probe and a silicon substrate coated with polymethyl methacrylate (PMMA). The resulting multi-level formation is shown in a top view in FIG. 12A. Changing parameters are shown as a function of exposure time in the graph of FIG. 12B.

Figure 12A:
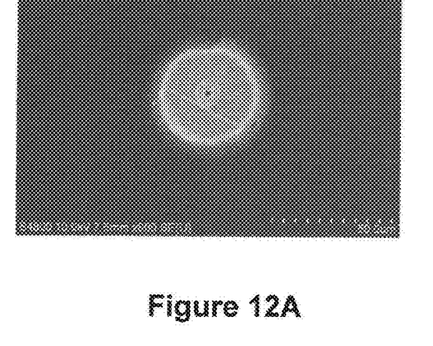
FIGS. 12A and 12B illustrate a multi-level indentation formed in a substrate according to methods as described herein.
Figure 12B:
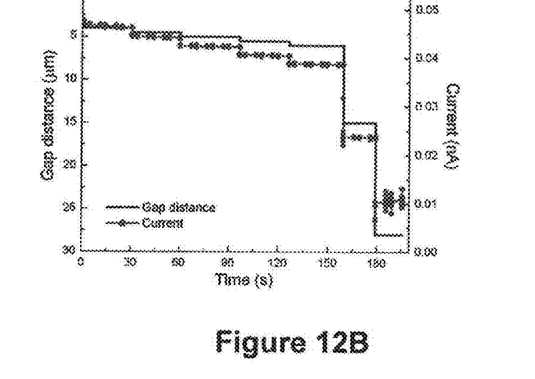

The resulting formation included an inner central hole (dark circle) that was exposed for 150 seconds at about 0.04 nA, which led to complete removal of the PMMA. The surrounding, lighter colored circle was created at a gap distance of about 15 μm, and the outer circle was created at a gap distance of about 28 μm. The PMMA of the outer two circles was not completely removed, although the inner circle (15 μm) was deeper; i.e., more PMMA dissolution, than the out circle. The total exposure was dependent upon the current density.

EXAMPLE 4

Figure 13:
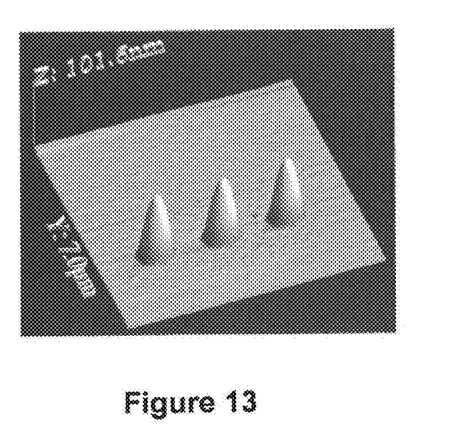
FIG. 13 illustrates a nanopillar array formed according to methods as described herein.

An array of nanopillars were formed on a silicon substrate including an approximately 30 nm silver layer on the upper surface, as illustrated in FIG. 13. Specifically, a single probe as described above in Example 1 was used in conjunction with a positioning stage. Following formation of a first structure, the stage was moved to form a second structure, and then the third structure, to form the organized array illustrated in FIG. 13.

EXAMPLE 5

Figure 14:
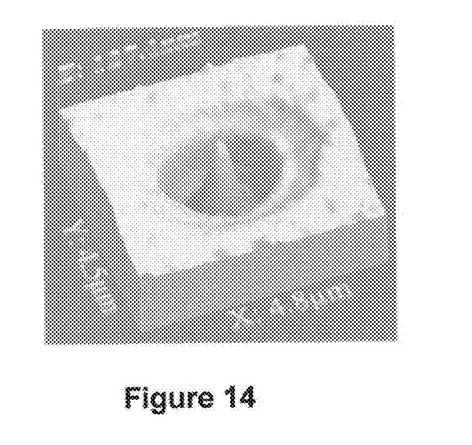
FIG. 14 illustrates another formation formed according to methods as described herein.

A process similar to that described in Example 3, above, was run on a silicon substrate coated with an approximately 100 nm layer of PMMA. Results are shown in FIG. 14. The structure was formed under similar conditions to experiments described above that were carried out on a metal-coated silicon base. As can be seen with reference to FIG. 14, the formed structure included a silicon nanopillar within a hole surrounded by PMMA.

What is claimed is:

1. A method for forming an element on a substrate comprising:
locating a probe tip at a distance of less than about 5 μm from a surface of a substrate such that there is a gap between the probe tip and the substrate surface, the substrate comprising a semiconducting material;
establishing a vacuum pressure of at least about $10^{-3}$ torr surrounding the probe tip and the substrate;
applying a bias voltage between the probe tip and the substrate and thereby establishing a current flow between the substrate and the probe tip via field emissions; and
maintaining the bias voltage for a pulse period, wherein upon establishment of a current density of at least about 600 A/m$^2$ at that area of the substrate surface that is closest to the probe tip, a structure develops from the surface of the substrate.

2. The method according to claim 1, wherein the probe tip comprises tungsten.

3. The method according to claim 1, wherein the probe tip is a carbon nanotube.

4. The method according to claim 3, wherein the carbon nanotube is a multiwalled carbon nanotube.

5. The method according to claim 1, wherein the substrate comprises silicon.

6. The method according to claim 1, wherein the semiconducting material is a doped semiconducting material.

7. The method according to claim 1, wherein the substrate is a multilayer substrate.

8. The method according to claim 7, wherein at least one layer of the substrate comprises a polymer.

9. The method according to claim 8, wherein the polymer is a conductive polymer.

10. The method according to claim 8, wherein the polymer is polymethyl methacrylate.

11. The method according to claim 7, wherein at least one layer of the substrate comprises a metal.

12. The method according to claim 11, wherein the metal is silver or gold.

13. The method according to claim 1, wherein the voltage is between about 100 and about 1000 volts.

14. The method according to claim 1, wherein the pulse period is less than about 200 seconds.

15. The method according to claim 1, wherein the structure has an aspect ratio of greater than about 1.

16. The method according to claim 1, wherein multiple structures develop from the surface of the substrate.

17. A device for forming a pattern element on a substrate, the device comprising:
a probe including a probe tip, the probe tip comprising an at least semiconductive material, the probe tip defining a tip diameter of less than about 500 nm;
a power supply connectable to the probe tip;
a stage, wherein the probe tip and the stage are locatable with respect to one another such that a substrate held on the stage can be held at a distance from the probe tip with the upper surface of the substrate less than about 5 μm from the probe tip; and
an enclosure, wherein the probe tip and the stage are within the enclosure.

18. The device of claim 17, wherein the probe tip is a carbon nanotube.

19. The device of claim 18, wherein the carbon nanotube is a multiwalled carbon nanotube.

20. The device of claim 17, further comprising a cantilever arm, wherein the probe tip is attached to the cantilever arm.

21. The device of claim 17, the device comprising multiple probe tips.

22. The device of claim 21, wherein the probe tips are at a distance from one another such that electron emissions from adjacent probe tips interfere with one another.

* * * * *

UNITED STATES PATENT AND TRADEMARK OFFICE
CERTIFICATE OF CORRECTION

| | | |
|---|---|---|
| PATENT NO. | : 7,818,816 B1 | Page 1 of 1 |
| APPLICATION NO. | : 12/243402 | |
| DATED | : October 19, 2010 | |
| INVENTOR(S) | : Reppert et al. | |

It is certified that error appears in the above-identified patent and that said Letters Patent is hereby corrected as shown below:

In the specification

Column 1, lines 15 - 17 states,

"The United States Government may have rights in this invention pursuant to National Science Foundation Grant NIRT 0304019."

Please correct this paragraph to read as follows:

-- This invention was made with government support under grant #0304019 awarded by the National Science Foundation. The government has certain rights in the invention. --

Signed and Sealed this
Twenty-sixth Day of April, 2016

Michelle K. Lee
*Director of the United States Patent and Trademark Office*